United States Patent [19]
Thurston et al.

[11] Patent Number: 5,883,782
[45] Date of Patent: Mar. 16, 1999

[54] APPARATUS FOR ATTACHING A HEAT SINK TO A PCB MOUNTED SEMICONDUCTOR PACKAGE

[75] Inventors: Mark Edward Thurston, Tokyo, Japan; Hong Xie, Phoenix, Ariz.

[73] Assignee: Intel Corporation, Santa Clara, Calif.

[21] Appl. No.: 811,640

[22] Filed: Mar. 5, 1997

[51] Int. Cl.$^6$ .................................................. H05K 7/20
[52] U.S. Cl. .......................... 364/704; 257/718; 361/719; 361/720
[58] Field of Search .................................. 165/80.2, 80.3, 165/185; 174/16.3; 257/706–707, 712–713, 726, 727; 361/704, 707, 709–710, 717–721, 722

[56] References Cited

U.S. PATENT DOCUMENTS

| | | | |
|---|---|---|---|
| D. 357,227 | 4/1995 | Smithers | D13/179 |
| 4,136,799 | 1/1979 | Albert | 220/415 |
| 4,587,595 | 5/1986 | Staples | 361/388 |
| 4,712,159 | 12/1987 | Clemens | 361/386 |
| 4,724,514 | 2/1988 | Kautman | 361/720 |
| 4,729,426 | 3/1988 | Hinshaw | 165/80.3 |
| 4,745,456 | 5/1988 | Clemens | 357/79 |
| 4,972,294 | 11/1990 | Moses, Jr. et al. | 361/386 |
| 5,138,524 | 8/1992 | Smithers | 361/386 |
| 5,162,975 | 11/1992 | Matta et al. | 361/720 |
| 5,274,193 | 12/1993 | Bailey et al. | 174/16.3 |
| 5,295,043 | 3/1994 | Beijer | 361/704 |
| 5,311,395 | 5/1994 | McGaha et al. | 361/720 |
| 5,323,845 | 6/1994 | Kin-shon | 165/80.3 |
| 5,329,426 | 7/1994 | Villani | 361/719 |
| 5,331,507 | 7/1994 | Kyung et al. | 361/720 |
| 5,377,078 | 12/1994 | Kalis | 361/707 |
| 5,381,305 | 1/1995 | Harmon et al. | 361/704 |
| 5,436,798 | 7/1995 | Wieland, Jr. | 361/710 |
| 5,466,970 | 11/1995 | Smithers | 257/712 |
| 5,473,510 | 12/1995 | Dozier, II | 361/719 |
| 5,488,539 | 1/1996 | Testa et al. | 361/720 |
| 5,581,442 | 12/1996 | Morasas | 361/704 |
| 5,662,163 | 9/1997 | Mira | 361/720 |
| 5,665,279 | 9/1997 | Lazenby et al. | 361/720 |

FOREIGN PATENT DOCUMENTS 2163598  2/1986  United Kingdom .................. 257/718

*Primary Examiner*—Gregory Thompson
*Attorney, Agent, or Firm*—Blakely, Sokoloff, Taylor & Zafman LLP

[57] ABSTRACT

An apparatus for removing heat from the top surface of an electronic package. In one embodiment, an electronic package is attached to the top-side of a printed circuit board. The printed circuit board has a first set of through holes positioned symmetrically about the electronic package. A heat sink is placed in thermal contact with the top surface of the electronic package. The heat sink has a second set of through holes that correspond and are align with the first set of through holes. Posts having a first end portion and a second end portion are positioned within the first and second set of through holes such that the first end portions are in abutting engagement with the top surface of the heat sink, and the second end portions protrude from the bottom-side of the printed circuit board. The heat sink is held in place by a spring clip. The spring clip includes a substantially flat cross member and a pair of legs extending outward from either side of the cross member. Each of the legs terminate at a flange section. The flange section of each leg has an opening for receiving the second end portion of a post. Attachment of the heat sink to the electronic package is accomplished by positioning the spring clip over the bottom-side of the printed circuit board such that the cross member is positioned substantially centered in one direction with respect to the electronic package mounted on the top-side surface of the board. Once the spring clip is properly positioned, the spring clip legs are compressed such that the second end portions of the post are disposed and secured within the flange openings of the clip.

10 Claims, 8 Drawing Sheets

APPARATUS FOR ATTACHING A HEAT SINK TO A PCB MOUNTED SEMICONDUCTOR PACKAGE

FIELD OF THE INVENTION

The present invention relates to a heat sink assembly for an integrated circuit.

BACKGROUND OF THE INVENTION

A printed circuit board (PCB) is a composite of organic and inorganic materials with external and internal wiring, allowing electronic components to be mechanically supported and electrically connected. A PCB typically contains multiple insulation layers sandwiched between metal layers. A typical PCB contains at least one metal layer that is patterned to transfer signals between the electronic components, one power plane for distributing voltage throughout the PCB, and one ground plane.

The method and manner in which components are attached to a PCB has changed as integrated circuits and circuit board technology has improved. Today, a significant number of components are surface mounted to the PCB while others have pins soldered into plated-through-holes. In surface-mount technology, the components are soldered directly to the surface of a PCB via solder ball connections, in contrast to the through-hole mode in which the component leads are inserted through a PCB. The driving force for the use of surface-mount technology is the reduced package size, improved utilization of board real estate and assembly simplicity.

As integrated circuit technology has improved, substantially greater functionality has been incorporated into the devices. As integrated circuits have expanded in functionality, the size of the devices has diminished resulting in higher clocking frequencies and increased power consumption. As a consequence, the integrated circuit devices of today generate more heat while possessing smaller surface areas to dissipate the heat. Therefore, it is important to have a high rate of heat transfer from the integrated circuit package to maintain the junction temperatures of the integrated circuit within safe operating limits. Excessive junction temperatures may affect the performance of the circuit and cause permanent degradation of the chip. For this reason, heat sinks are typically mounted to the top surface of the package housing to increase the thermal performance of the package.

FIG. 1 illustrates a prior art method of attaching a heat sink to an integrated circuit package. FIG. 1 shows a surface mounted package 102 that is electrically coupled to a printed circuit board 104 via a plurality of solder ball interconnections 103. Generally, package 102 includes a heat slug 108 that is thermally coupled to the integrated circuit die that is housed within the package. Heat is removed from package 102 by a heat sink 106 that is thermally coupled to heat slug 108. A highly conductive thermal grease 110 is normally placed between heat slug 108 and heat sink 106. A thin layer of thermal grease 110 ensures that the thermal interface between heat slug 108 and heat sink 106 is devoid of any air gaps, which would reduce the heat removal capability of the packaged device. As shown in FIG. 1, a heat sink clip 112 is used to secure heat sink 106 to the packaged device. Clip 112 generally includes two legs 113a and 113b that terminate at hooked sections 114a and 114b. (Clip 112 is generally referred to as a "spider clip.") Attachment of the heat sink 106 to the package 102 is achieved by placing the heat sink clip on top of heat sink 106 and compressing legs 113a and 113b inwardly to enable the insertion of hooks 114a and 11b into through holes 116a and 116b formed within printed circuit board 104. Hooks 114a and 114b bear against the bottom side of printed circuit board 104 to provide a force to heat sink 106, forcing it to seat against heat slug 108.

As noted above, as integrated circuit technology has improved, substantially greater functionality has been incorporated into the devices. As a result, the integrated circuit devices of today generate more heat and require the use of heat sinks that are both larger and heavier than those used in the past. In order to meet certain shock and vibration performance requirements, a larger force must be applied to the heat sink to hold it securely in place.

Although the use of a spider clip to attach a heat sink to package has proved sufficient in the past, a number of problems arise when extending its use to the attachment of the larger and heavier heat sinks of today. First, the amount of force that may be exerted by a prior art spider clip is very limited. If the force necessary to hold a heat sink in place is too high, the spider clip hooks can easily become dislodged from the printed circuit board.

As described above, the force created by spring clip 112 causes hooks 114a and 114b to bear against the bottom side of the printed circuit board. A moment force is produced within the board since the forces acting on the printed circuit board are located at points away from the center of the package. Since the printed circuit board is flexible, this moment force causes the board to warp when hooks 114a and 114b bear against the bottom side of the board. This introduces a number of problems. First, warping or bending of the printed circuit board can cause a crack to form in the board. These cracks may cut metal traces in the board to create electrical opens. Another problem arises when the integrated circuit package attached to the board is a surface mounted device. As shown in FIG. 1, a surface mounted device is electrically coupled to the printed circuit board by a multitude of solder ball interconnections 103. The solder bumps are very small (approximately 4 to 8 mils in diameter) and are easily damaged. Excessive warping of the printed circuit board can cause these solder bump interconnections to fatigue or crack, thus resulting in an inoperable device.

Bending of the printed circuit board can also affect the thermal performance of the integrated circuit package. As previously discussed, a thermal grease is generally used at the heat sink/package interface to enhance the transfer of heat at the interface. The gap between the heat sink and package must be held to within a tight tolerance. The thickness of this gap, which is commonly referred to as the "bond line thickness", is chosen to account for the differences in the thermal expansion between the heat sink and package during the thermal cycling of the device. If the printed circuit board is permitted to warp, it may be impossible to maintain the proper bond line thickness which is critical to the thermal performance of the electronic device.

Therefore, what is needed is an apparatus for attaching a heat sink to an electronic package that solves the aforementioned problems.

SUMMARY OF THE INVENTION

An apparatus for removing heat from a surface of an electronic package that is attached to a printed circuit board is disclosed.

In one embodiment, an electronic package is attached to the top-side of a printed circuit board. The printed circuit board has a first set of through holes positioned symmetrically about the electronic package. A heat sink is placed in thermal contact with the top surface of the electronic package. The heat sink has a second set of through holes that correspond and align with the first set of through holes. Posts having a first end portion and a second end portion are positioned within the first and second set of through holes such that the first end portions are in abutting engagement with the top surface of the heat sink, and the second end portions protrude from the bottom-side of the printed circuit board. The heat sink is held in place by a spring clip. The spring clip includes a substantially flat cross member and a pair of legs extending outward from either side of the cross member. Each of the legs terminate at a flange section. The flange section of each leg has an opening for receiving the second end portion of a post. Attachment of the heat sink to the electronic package is accomplished by positioning the spring clip over the bottom-side of the printed circuit board such that the cross member is positioned substantially centered in one direction with respect to the electronic package mounted on the top-side surface of the board. Once the spring clip is properly positioned, the spring clip legs are compressed such that the second end portions of the post are disposed and secured within the flange openings of the clip.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus for removing heat from the surface of an electronic package is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention. This discussion will mainly be limited to those needs associated with removing heat from the top surface of a BGA (Ball Grid Array) package. It will be recognized, however, that such focus is for descriptive purposes only and that the apparatus and methods of the present invention are applicable to other electronic devices and other forms of packaging.

Figure 1:
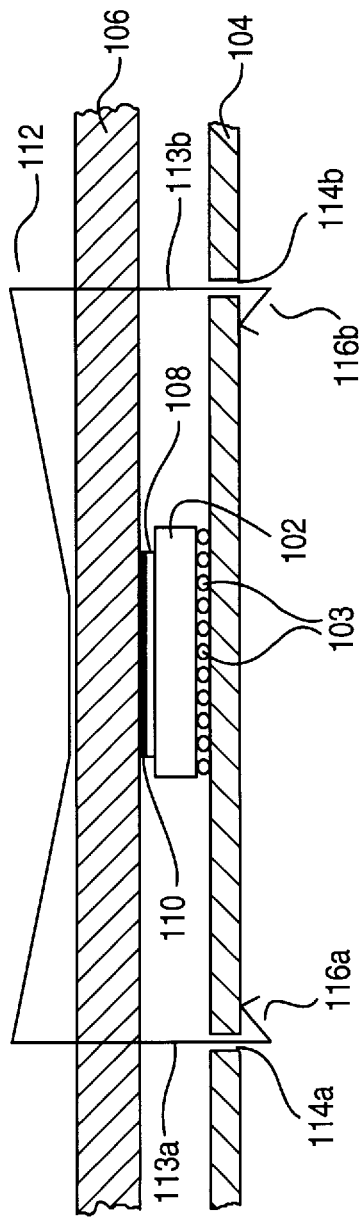
FIG. 1 illustrates a prior art heat sink attachment mechanism.
Figure 2:
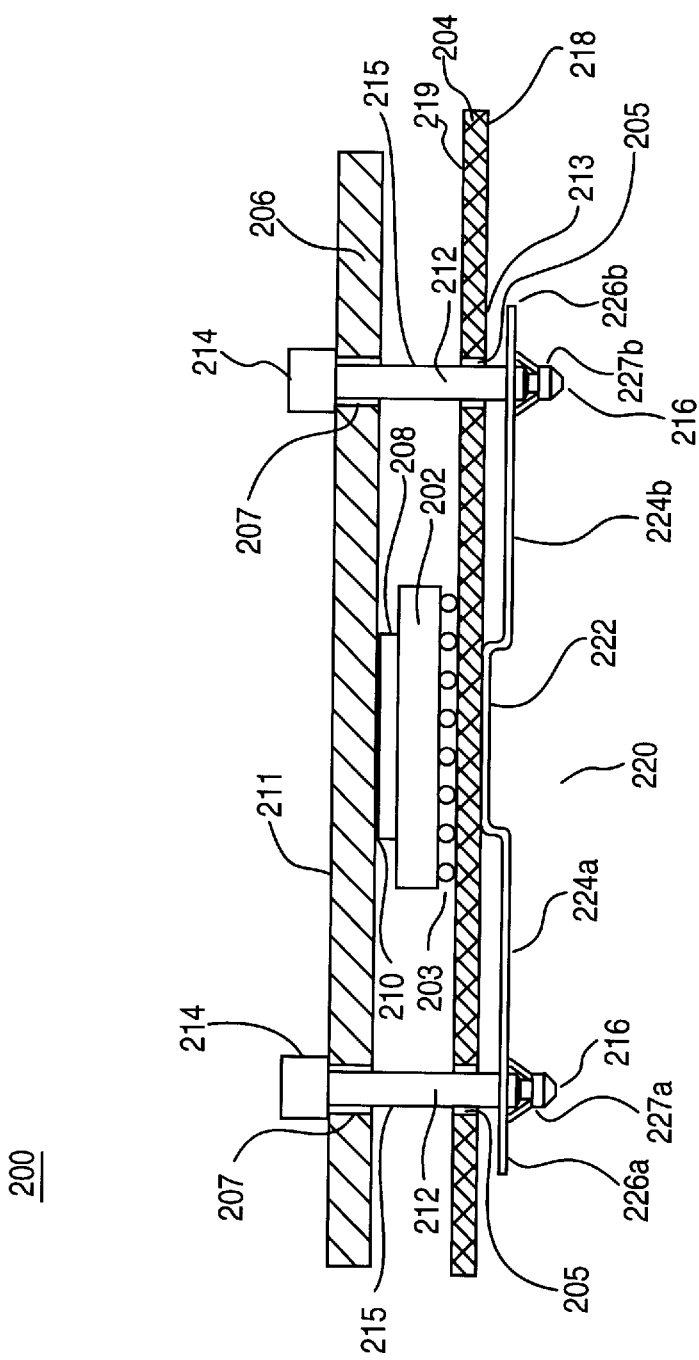
FIG. 2 illustrates a side view of a heat sink attachment apparatus in one embodiment of the present invention.

FIG. 2 illustrates a side view of a heat removal apparatus 200 in one embodiment of the present invention. As illustrated in FIG. 2, a BGA package 202 containing an integrated circuit die (not shown) is surface mounted to a printed circuit board 204 via a plurality of solder ball interconnections 203. Package 202 generally includes a heat slug 208 that is attached to the integrated circuit die that is housed within the package. Heat is removed from package 202 by a heat sink 206 that is thermally coupled to heat slug 208. In one embodiment, heat sink 206 is a finned heat sink. A thermally conductive thermal grease 210 is disposed between heat sink 206 and heat slug 208. In one embodiment, heat sink 206 and PCB 204 each include a corresponding set of through holes 207 and 205, respectively. Posts 212, each possessing a head 214, a shank 215 and an enlarged end portion 216, are positioned within through holes 205 and 207 such that the heads 214 are in abutting engagement with the top surface 211 of heat sink 206, and the enlarged end portions 216 protrude from the bottom-side surface 218 of printed circuit board 204. Heat sink 206 is held in place by a spring clip 220. Spring clip 220 includes a substantially flat cross member 222 and a pair of legs 224a and 224b that extend outward from either side of cross member 222. Each of legs 224a and 224b terminate at a flange section 226a and 226b. In one embodiment, flanges 226a and 226b include tabbed openings 227a and 227b for receiving the enlarged end portions 216 of posts 212.

Figure 3A:
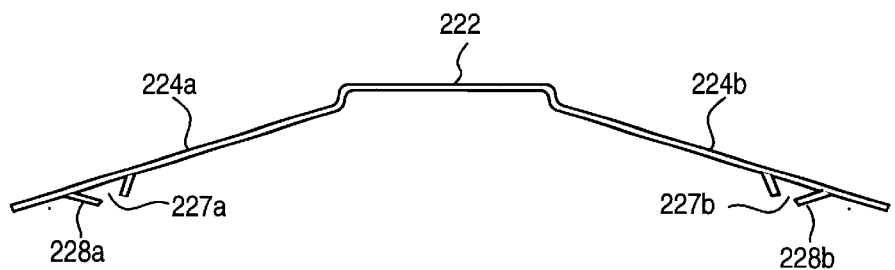
FIG. 3A illustrates a side-view of a spring clip in one embodiment of the present invention.
Figure 3B:
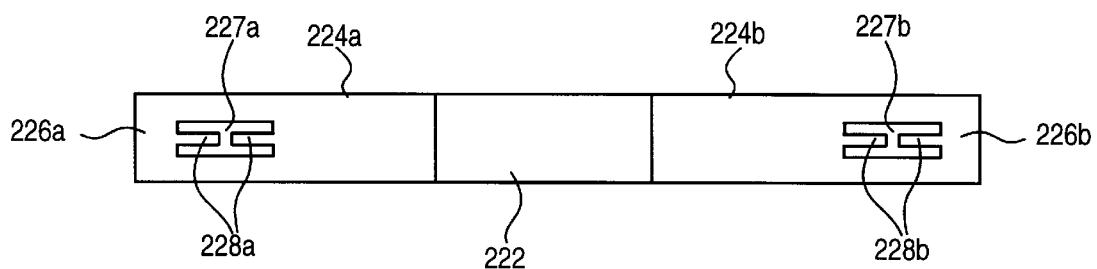
FIG. 3B shows a top-view of the spring clip illustrated in FIG. 3A.
Figure 4A:
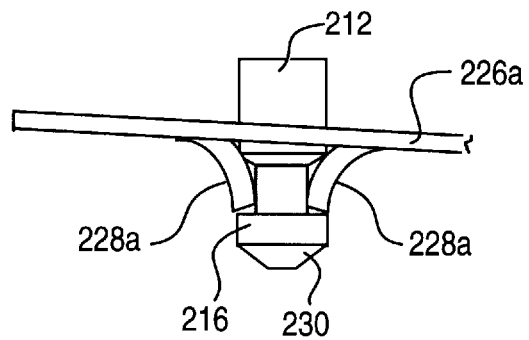
FIG. 4A illustrates how an enlarged end of a post is secured to the spring member via a Tinnerman clip arrangement.
Figure 4B:
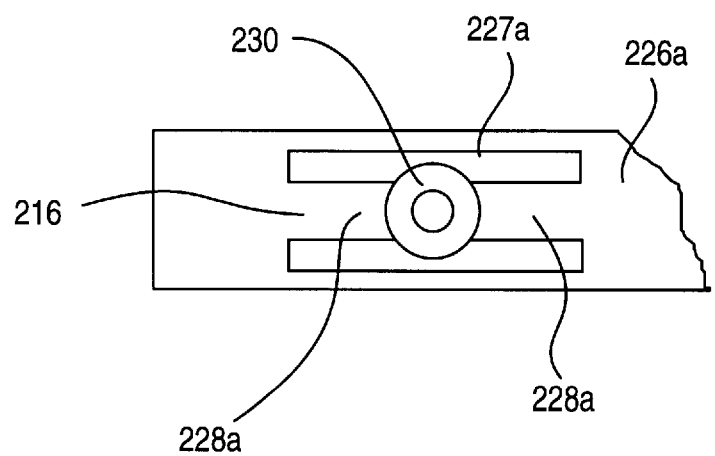
FIG. 4B illustrates a bottom view of the clip shown in FIG. 4A.

Turning to FIGS. 3A and 3B, an enlarged side view and an enlarged bottom view of spring clip 220 are shown. As depicted in FIG. 3A, tabs 228a and 228b are disposed within openings 227a and 227b, respectively. The tabs are bent slightly downward and are configured such that the diameter of the openings at the apex of the tabs is slightly smaller than the diameter of enlarged end portions 216 of posts 212. Tabs 228a and 228b are designed to yield when the enlarged end portion 216 of a post is pressed against the them. Attachment of the spring clip 220 to posts 212 is accomplished by placing the enlarged end portion 216 of each post into the tabbed openings 227a and 227b and exerting a force at the flanged sections 226a and 226b to force the enlarged end portions through the tabbed openings. The force exerted causes the enlarged end portion of each post to press against tabs 228a and 228b, causing the tabs to yield in an outward direction. When the enlarged head portions 216 are fully inserted into the tabbed openings, tabs 228a and 228b return to their initial position to lock the posts 212 in position, as shown in FIGS. 4A and 4B.

Thus, in accordance with one embodiment of the present invention, heat sink 206 is attached to electronic package 202 by first positioning the spring clip 220 over the bottom-side surface 218 of printed circuit board 204 such that the tabbed openings 227a and 227b are positioned over the enlarged end portions 216 of posts 212. When the tabbed openings 227a and 227b of the spring clip are properly aligned with their respective posts 212, the spring clip cross member 222 is positioned substantially centered in one direction with respect to the electronic package mounted on the top-side surface 219 of the board. Once spring clip 220 is properly positioned, the spring clip legs 224a and 224b are compressed such that the enlarged end portions 216 of posts 212 are snapped into the tabbed openings 227a and 227b of the clip. The load applied by spring clip 220 is then transferred to heat sink 206 via posts 212.

In one embodiment, spring clip 220 and posts 212 are made of stainless steel. To reduce manufacturing costs, it is generally preferable to stamp the spring clips from a thin sheet of stainless steel. Bending of the spring clip into its configuration may be accomplished during the stamping process or subsequent thereto. Heat sink 206 and heat slug 208 are made of a highly conductive material. In one embodiment heat sink 206 is made of aluminum and heat slug 208 is made of copper.

In a preferred embodiment, two spring clips are used to secure the heat sink to the integrated circuit package 202. at a The use of two spring clips enhances the stability of the apparatus. It is important to note, that the present invention is not limited to the use of two spring clips. In some applications the use of a single spring clip, or the use of more than two spring clips may be desirable.

As noted earlier, there are a number of problems associated with the use of prior art heat sink attachment mechanism. Many of the problems associated with these prior art methods are caused by the PCB reacting against the forces being applied to it by the heat sink clip. Since the PCB consist primarily of laminated epoxy layers, these reaction forces cause the board to warp. In the present invention, the load applied by the spring clip is reacted by the rigid heat sink rather than the flexible PCB. Since the heat sink is typically made of a rigid metal, such as aluminum, the problem of warping is greatly reduced. As a result, a significantly higher load may be applied to the spring clip to hold the heat sink in place.

The use of lock tabs to secure the posts to the flanged ends of the spring clip also offers a number of advantages. This feature provides the spring clip with a self-aligning feature. As shown in FIG. 4A and 4B, the enlarged end portions 216 of posts 212 include a conical surface 230. Hence, as the enlarged ends of the posts make contact with the spring clip tabs 228a, the enlarged end of the post is guided along the tabs and through the tabbed opening as the legs of the spring clip are compressed. The self-alignment feature permits the use of less stringent manufacturing tolerances, which, in turn, reduces manufacturing costs. In addition, the locking arrangement between the spring clip tabs and enlarged end portions 216 of posts 212 makes the apparatus resistant to tampering.

Since the difference in thermal expansion coefficients between the PCB 204 and heat sink 206 is typically large, it is necessary that the heat sink attachment method posses a certain degree of flexibility. Otherwise, the ability to maintain a proper bond line thickness between the heat sink 206 and heat slug 208 becomes a formidable task. In addition to the features already discussed, the heat sink attachment method of the present invention provides the heat removal apparatus of the present invention with a high degree of flexibility. This flexibility permits the bond line thickness to be held to within a tight tolerance, thus enhancing the thermal performance of the apparatus.

Figure 7A:
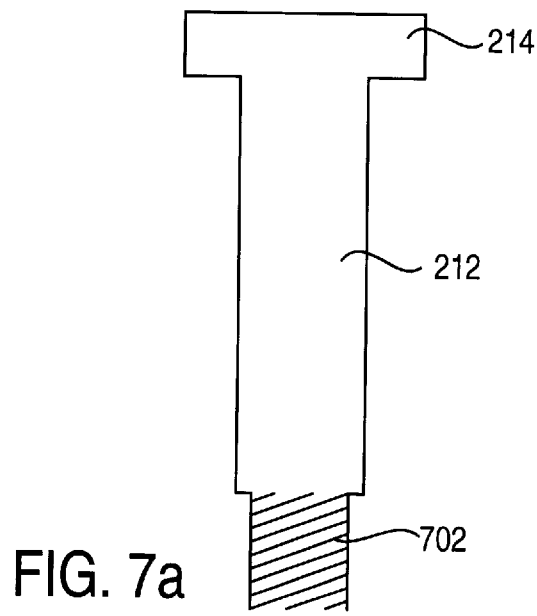
FIG. 7A illustrates a post with a threaded end in another embodiment of the present invention.
Figure 7B:
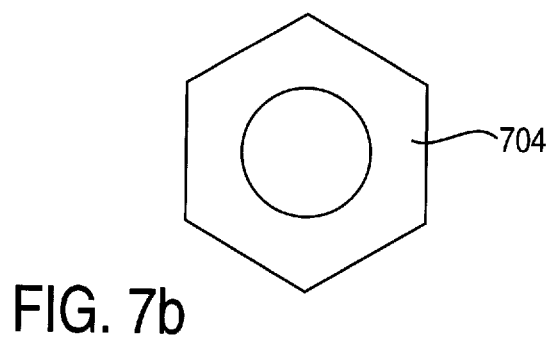
FIG. 7B illustrates a top view of a threaded nut in another embodiment of the present invention.
Figure 7C:
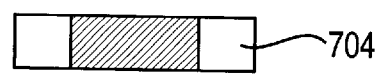
FIG. 7C illustrates a side view of a threaded nut in another embodiment of the present invention.
Figure 8:
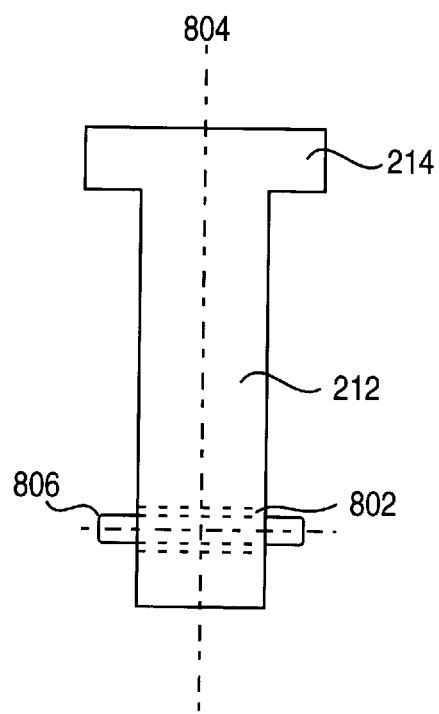
FIG. 8 illustrates an attachment means in another embodiment of the present invention.

In the foregoing discussion, posts 212 are attached to spring clip 220 with the use of a tabbed opening. This configuration is commonly referred to as a Tinnerman clip. Note, however, that other attachment means may be used to secure posts 212 to spring clip 220. For instances, in lieu of having an enlarged end portion, external threads 702 may be provided at the protruding end of the posts, as shown in FIG. 7A. In such an embodiment, the tabbed openings 227a and 227b are replaced with through openings having a diameter that is slightly larger than the diameter of the posts. Attachment of the spring clip 220 to the posts may then be accomplished by compressing the spring clip legs 224a and 224b such that the threaded end portions of the posts are disposed within the openings. A threaded nut 704 is then threaded onto the end portion of each post to secure the posts 212 to spring clip 220. FIGS. 7A and 7B show threaded nut 704.

In another embodiment of the attachment means, the end portions of the posts have through holes 802 which are substantially perpendicular to the longitudinal axis 804 of the post. A pin 806 is disposed within the hole 802 and positioned as to protrude from the post 212. These protruding portions of the pins 806 are to engage the flange sections of the spring clip.

Figure 5:
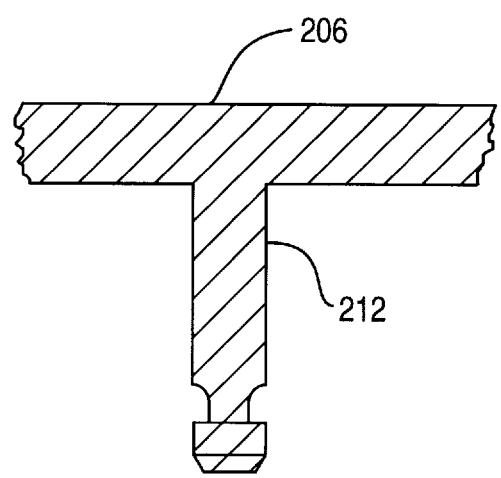
FIG. 5 illustrates a post arrangement in another embodiment of the present invention.

In yet another embodiment of the present invention, posts 212 are integrally formed with heat sink 206 as depicted in FIG. 5.

Figure 6:
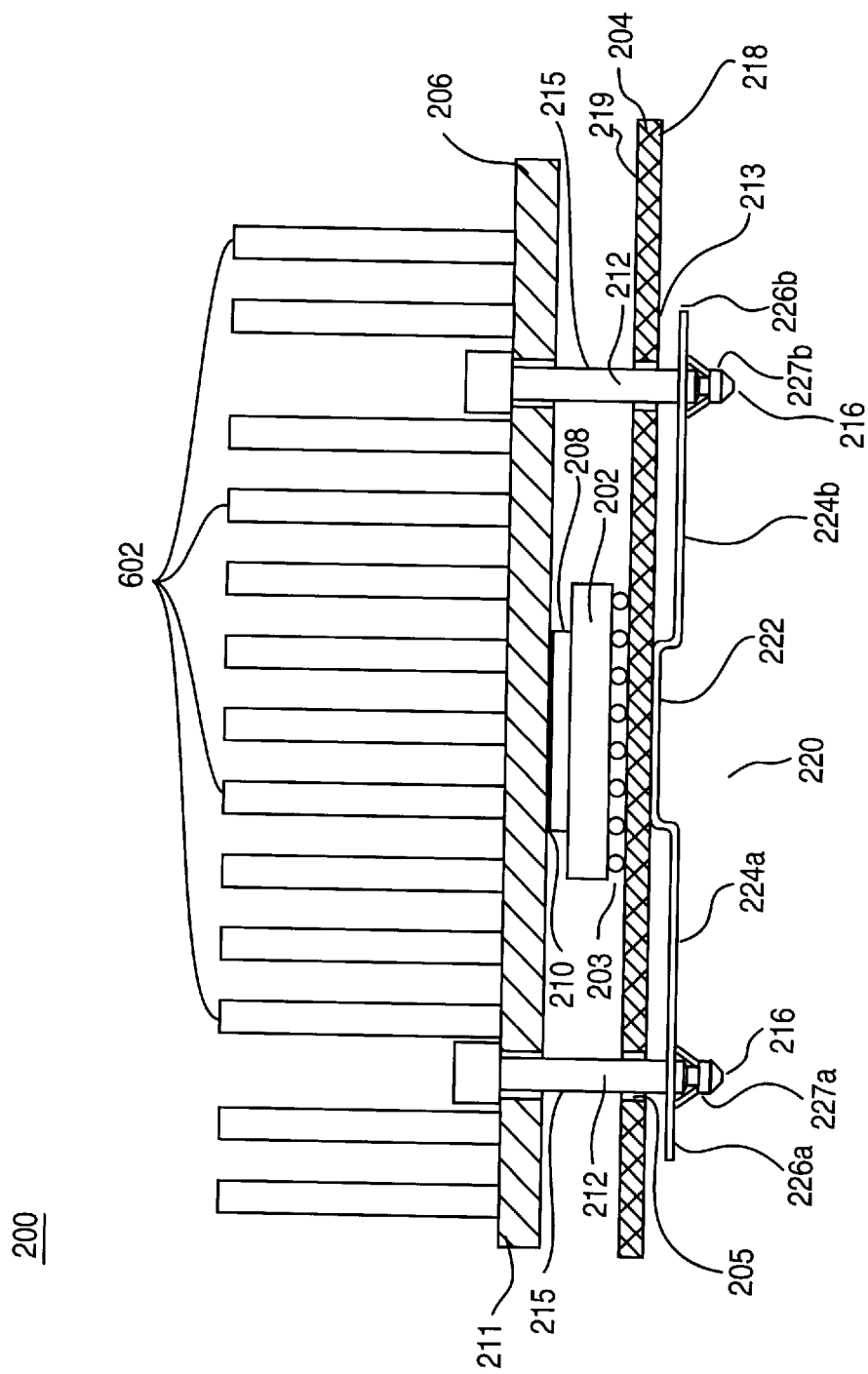
FIG. 6 illustrates a finned heat sink in another embodiment of the present invention.

FIG. 6 shows yet another embodiment of the present invention. The heat sink 206 is a fined heat sink. A plurality of fins 602 extend from the upper surface 211 of heat sink 206.

Thus, what has been described is an apparatus for removing heat from the surface of an electronic package that is attached to a printed circuit board. In the foregoing detailed description, the apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus comprising:

an electronic device;

a printed circuit board having a top-side surface and a bottom-side surface, said electronic device attached to the top-side surface of said printed circuit board, said printed circuit board having a plurality of through holes extending from the top-side surface to the bottom side surface, said circuit board through holes being positioned about the electronic device;

a heat slug thermally coupled to the electronic device;

a heat sink thermally coupled to said heat slug;

a plurality of posts removably secured to said heat sink and positioned within said circuit board through holes, each of said posts having an end portion protruding from said back-side surface of said printed circuit board;

a spring clip comprising a substantially flat cross member and a pair of symmetric legs extending outward from either side of said cross member, each of said legs terminating at a flange section, said flange section having an opening for receiving said end portions of said posts; and coupling means for securing said end portions of said posts to said flange sections.

2. The apparatus of claim 1 wherein said end portions of said post comprise external threads and said coupling means comprises a nut having mating internal threads.

3. The apparatus of claim 1 wherein each of said end portions of said posts includes a through hole having an axis that is substantially perpendicular to the longitudinal axis of said post and said coupling means comprises a pin disposed within said through hole, said pin having protruding end portions for engaging said flange section.

4. The apparatus of claim 1 wherein said posts and said heat sink are integrally formed.

5. The apparatus of claim 1 wherein said electronic device comprises a BGA package.

6. The apparatus of claim 1 wherein said heat sink is a finned heat sink.

7. An apparatus comprising:

an electronic device;

a printed circuit board having a top-side surface and a bottom-side surface, said electronic device attached to the top-side surface of said printed circuit board, said printed circuit board having a plurality of through holes extending from the top-side surface to the bottom side surface, said through holes being positioned about the electronic device;

a heat slug thermally coupled to the electronic device a heat sink thermally coupled to said heat slug;

a plurality of posts removably attached to said heat sink and positioned within said circuit board through holes, each of said posts having an enlarged end portion protruding from said back-side surface of said printed circuit board; and a spring member comprising a substantially flat cross member and a pair of symmetrical legs extending outward from either side of said cross member, each of said legs having an end section, wherein each said end section has an aperture having a diameter and an edge, each said end section having at least two tabs having a top and a bottom, the tab bottoms attached to and protruding from the aperture edge at an angle to form an apex having a diameter, said aperture diameter is slightly larger that said end portions of said posts, and said apex diameter is slightly smaller than said end portions of said posts.

8. The apparatus of claim 7 wherein said posts and said heat sink are integrally formed.

9. The apparatus of claim 7 wherein said electronic package comprises a BGA package.

10. The apparatus of claim 7 wherein said heat sink is a finned heat sink.

* * * * *